United States Patent
Risch et al.

(10) Patent No.: US 6,417,043 B1
(45) Date of Patent: Jul. 9, 2002

(54) MEMORY CELL CONFIGURATION AND FABRICATION METHOD

(75) Inventors: Lothar Risch, Neubiberg; Wolfgang Rösner; Ties Ramcke, both of München; Hermann Jacobs, Bruckmühl, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/528,268

(22) Filed: Mar. 17, 2000

Related U.S. Application Data

(63) Continuation of application No. PCT/DE98/02618, filed on Sep. 4, 1998.

(30) Foreign Application Priority Data

Sep. 17, 1997 (DE) .......................................... 197 40 945

(51) Int. Cl.$^7$ ...................... H01L 29/76; H01L 21/8242
(52) U.S. Cl. ...................... 438/241; 257/390; 365/171; 365/173
(58) Field of Search ................................. 438/275, 270, 438/241; 257/295, 390, 392, 393; 365/171, 173, 178

(56) References Cited

U.S. PATENT DOCUMENTS

| | | | |
|---|---|---|---|
| 3,863,231 A | | 1/1975 | Taylor |
| 5,863,231 A | | 1/1975 | Taylor |
| 5,429,988 A | | 7/1995 | Huang et al. |
| 5,607,599 A | * | 3/1997 | Ichihara et al. ................ 216/22 |
| 5,640,343 A | | 6/1997 | Gallagher et al. |
| 5,840,608 A | | 11/1998 | Chang |
| 5,847,442 A | | 12/1998 | Mills et al. |
| 4,831,427 A | * | 5/1999 | Coleman, Jr. ................. 357/27 |
| 5,920,500 A | * | 7/1999 | Tehrani et al. .............. 365/173 |
| 6,104,633 A | * | 8/2000 | Abraham et al. ............ 365/171 |
| 6,127,231 A | * | 10/2000 | Mori ............................ 438/275 |
| 6,130,835 A | * | 10/2000 | Scheuerlein ................. 365/171 |
| 6,163,477 A | * | 12/2000 | Tran ............................. 365/173 |
| 6,194,751 B1 | * | 2/2001 | Evans, Jr. .................... 257/295 |
| 6,122,019 A1 | * | 4/2001 | Klose et al. ................. 438/275 |
| 6,256,223 B1 | * | 7/2001 | Sun ............................. 265/171 |
| 6,278,629 B1 | * | 8/2001 | Mizuhashi et al. ......... 365/104 |

FOREIGN PATENT DOCUMENTS

| | | |
|---|---|---|
| DE | 44 34 725 C1 | 5/1996 |
| FR | 2.071.501 | 9/1971 |
| JP | 08255843 | 1/1996 |
| TW | 307 048 | 6/1997 |

OTHER PUBLICATIONS

C. de Graaf et al.: "A Novel High–Density Low–Cost Diode Programmable Read Only Memory", 1996 IEEE, IEDM, pp. 189–192.

"High Speed Fixed Memories Using Large–Scale Integrated Resistor Matrices" (David et al.), dated Aug. 1968, IEEE Transactions on Computers, vol. C–17, No. 8, pp. 721–728.

"7. The Operations Amplifier, 7.7 Frequency Response Correction, 7.8 Measuring Operations Amplifier Data", pp. 152–1571.

* cited by examiner

Primary Examiner—Michael S. Lebentritt
(74) Attorney, Agent, or Firm—Laurence A. Greenberg; Werner H. Stemer; Gregory L. Mayback

(57) ABSTRACT

Resistors are connected between word lines and bit lines running transversely with respect thereto. The resistors have a higher resistance than the word lines and the bit lines. The bit lines are each connected to a sense amplifier which regulates the potential on the respective bit line to a reference potential and at which an output signal can be picked off. If one of the word lines is selected and all the other word lines are put at reference potential, then the resistance of the resistor, which is assigned to an information item, can be read from the output signal.

5 Claims, 2 Drawing Sheets

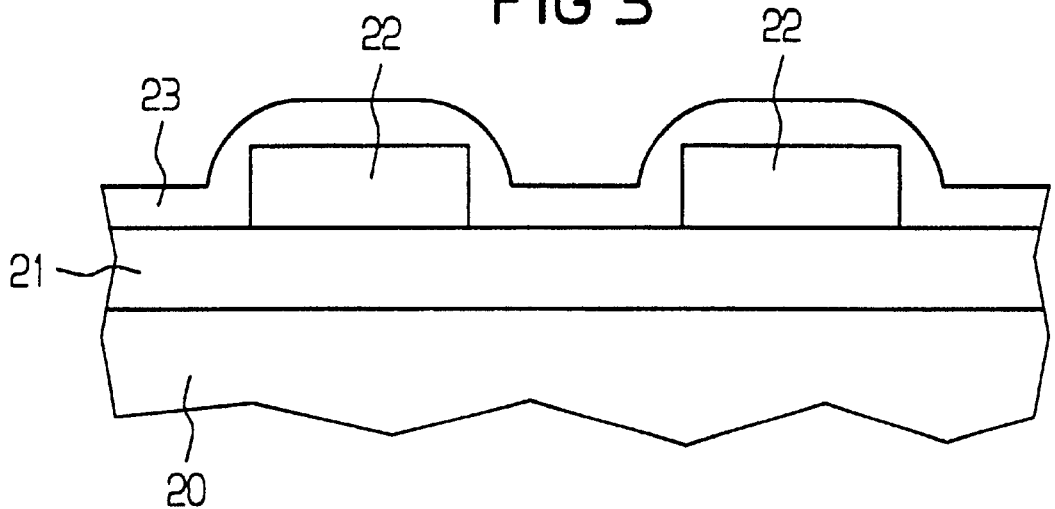
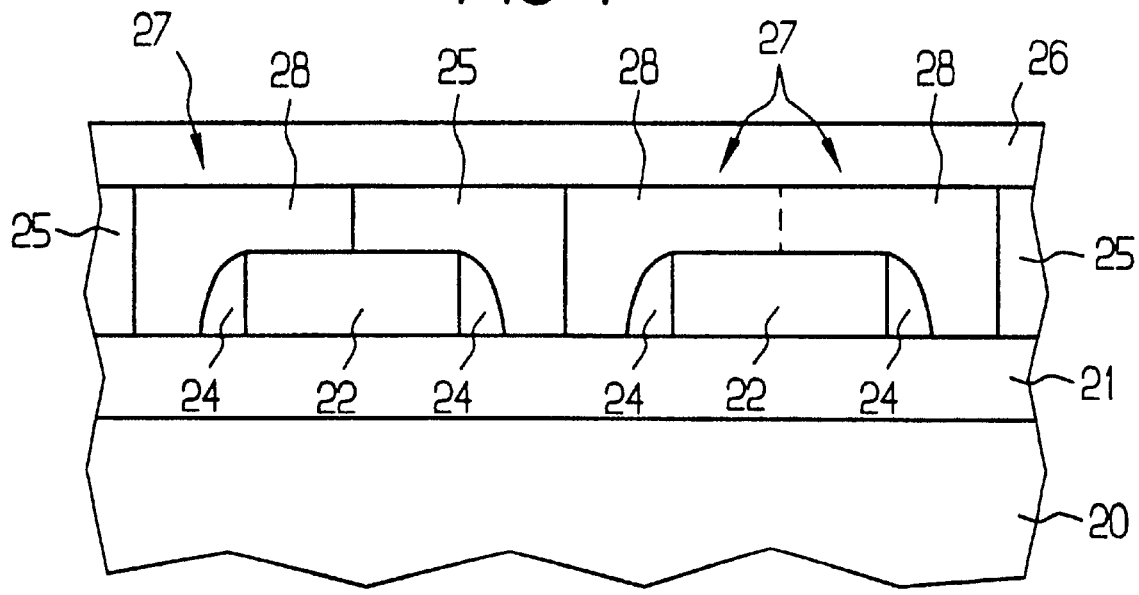

MEMORY CELL CONFIGURATION AND FABRICATION METHOD

CROSS-REFERENCE TO RELATED APPLICATION

This is a continuation of copending international application PCT/DE98/02618, filed Sep. 4, 1998, which designated the United States.

BACKGROUND OF THE INVENTION

Field of the Invention

The invention relates to a memory cell configuration which is suitable, inter alia, as a read-only memory. Memory configurations to which data are permanently written in digital form are referred to as read-only memories, or ROMs.

Plastic disks, so-called compact disks or CDs, coated with aluminum are in widespread use as read-only memories for very large volumes of data. These plastic disks have two different kinds of point-like depressions in the coating, which are assigned to the logic values zero and one. The information is stored digitally in the arrangement of the depressions.

In order to read the data which are stored on a compact disk, the point-like depressions are scanned by means of a laser diode and a photocell. This requires a reader equipped with moving parts that are subjected to mechanical wear, require a comparatively large volume and allow only slow data access. The reading apparatus is furthermore sensitive to vibrations and can thus be used only to a limited extent in mobile systems.

Semiconductor-based storage devices are also known. See, for example, commonly assigned U.S. Pat. No. 5,973,373 (German patent DE 44 34 725 C1). These semiconductor-based memories have MOS transistors as memory cells. The transistors are selected via the gate electrode connected to a word line. The input of the MOS transistor is connected to a reference line, and the output is connected to a bit line. An assessment is carried out during the reading operation to determine whether or not a current is flowing through the transistor. The logic values zero and one are assigned accordingly. In technical terms, the storage of zero and one is effected as follows: in memory cells in which the logic value assigned to the state "no current flow through the transistor" is stored, no MOS transistor is fabricated or no conductive connection to the bit line is realized or a MOS transistor having a higher threshold voltage is realized. The higher threshold voltage of the MOS transistor can be obtained by corresponding implantation in the channel region or by means of a higher gate oxide density.

Further semiconductor memories have been proposed which have diodes as memory cells. The diodes are each connected between word and bit lines (see, for example C. de Graaf et al., IEDM 1996, page 189). Due to the fact, however, that the diodes are disadvantageous in terms of electrical behavior compared with the transistors, these concepts have not gained acceptance in products.

Semiconductor-based memories allow random access to the stored information. The electrical power required to read the information is distinctly less than in a reading apparatus having a mechanical drive. Since a mechanical drive is not required for reading the information, the mechanical wear and the sensitivity to vibrations are obviated. These memories can therefore be used for mobile systems as well. However, owing to the MOS transistor required per memory cell, they are technologically complicated to fabricate.

SUMMARY OF THE INVENTION

It is accordingly an object of the invention to provide a memory cell configuration and a fabrication method, which overcomes the above-mentioned disadvantages of the heretofore-known devices and methods of this general type and which allows fabrication with a reduced technological complexity.

With the foregoing and other objects in view there is provided, in accordance with the invention, a memory cell configuration, comprising:

a semiconductor layer structure having a plurality of substantially parallel word lines, a plurality of substantially parallel bit lines running transversely to the word lines, and an insulating layer between the word lines and the bit lines;

the insulating layer being formed with contact holes at crossover points between the bit lines and the word lines;

resistors having a resistance higher than a resistance of the word lines and a resistance of the bit lines connected between the word lines and the bit lines, the resistors each being arranged in a respective the contact hole between a respective the bit line and a respective the word line; and a sense amplifier connected to each the bit line for regulating a potential on the respective the bit line to a reference potential and for outputting an output signal.

The word lines may run both above and below the bit lines. Resistors having a higher resistance than the word lines and the bit lines are connected between the word lines and the bit lines. The bit lines are each connected to a sense amplifier by means of which the potential on the respective bit line can be regulated to a reference potential and at which an output signal can be picked off.

In this memory cell configuration, the logic values zero and one are realized as follows: resistors having two different resistances for the two different logic values are realized, or as follows: a resistor is fabricated for one of the logic values and no resistor is fabricated for the other of the logic values. In the case where a resistor is fabricated only for one of the logic values, it is accordingly the case that, in accordance with the stored information, only a portion of the bit lines is connected to a portion of the word lines via a resistor.

In this memory cell configuration, word lines and bit lines are connected to one another. The memory cell configuration can nevertheless be read, since the bit lines can be regulated to a reference potential in each case by means of the sense amplifier. The bit lines are regulated to ground potential, for example. If a word line is selected by the application of a signal, while all the other word lines are connected to reference potential, for example ground potential, then the output signal of the sense amplifier is dependent on the resistor via which the word line is connected to the bit line.

This resistor may have an infinite value for the case where one of the logic values is realized by no resistor being present.

In accordance with an added feature of the invention, the sense amplifier contains a feedback operational amplifier. If the inverting input of the operational amplifier is connected to the bit line, and the non-inverting input to ground potential, and if the output is connected to the inverting input via a feedback resistor, then the operational amplifier regulates the potential at the inverting input, that is to say on the bit line, to zero volts. The resistance of the resistor between the respective bit line and the selected word line then follows from the output signal of the operational amplifier and the feedback resistor of the operational amplifier.

In accordance with an additional feature of the invention, the resistors comprise first resistors and second resistors with mutually different resistances. The first resistors represent a first logic value and the second resistors represent a second logic value.

In accordance with another feature of the invention, the number of word lines is greater than the number of bit lines. This reduces the required number of sense amplifiers.

The memory cell configuration can be realized in different ways. By way of example, it can be realized using thin-film technology on a support plate made, for example, of glass, silicon or metal. The memory cell configuration is preferably realized as a semiconductor layer structure on a semiconductor substrate. A silicon wafer or an SOI substrate, for example, is suitable as the semiconductor substrate. The word lines and/or bit lines are formed as strip-type structures made of conductive material, for example metal, doped silicon and/or metal silicide, or as strip-type doped regions in the surface of the substrate. They are preferably fabricated at the same time as the formation of an interconnect plane, for example gate plane or metalization plane.

The use of a semiconductor substrate has the advantage that peripheral components, for example the sense amplifier, drive circuits or the like, can be contained in an integrated manner in the substrate.

Furthermore, the memory cell configuration can be realized in the two uppermost metalization layers of a semiconductor component which contains the sense amplifiers, inter alia, in the lower region.

With the above and other objects in view there is also provided, in accordance with the invention, a method of fabricating a memory cell configuration, which comprises the following steps:
  forming a plurality of substantially parallel word lines, a plurality of substantially parallel bit lines, and an insulating layer on a surface of a substrate, whereby the word lines run transversely to the bit lines and the insulating layer is arranged between the word lines and the bit lines;
  opening contact holes each arranged between one of the bit lines and one of the word lines at predetermined crossover points between the bit lines and the word lines in the insulating layer;
  forming a resistor in each of the contact holes and connecting the resistor between the respective bit line and the respective word line, the resistor having a higher resistance than the bit lines and the word lines;
  producing sense amplifiers each connected to a respective bit line, and enabling the sense amplifiers to regulate a potential on the respective bit line to a reference potential and to output an output signal.

In accordance with a further feature of the invention, the resistors are formed with at least one of the materials $Al_2O_3$, $SiO_2$, polysilicon, or amorphous silicon.

In accordance with again a further feature of the invention, the word lines are formed as follows:
  first of all, an auxiliary structure is produced with strip-type elements;
  a conductive layer is formed with essentially conformal edge coverage; and
  the word lines are then produced in the form of conductive spacers from the conductive layer by anisotropic etching which is selective with respect to the auxiliary structure.

In other words, the memory cell configuration is preferably fabricated using semiconductor technology. The word lines and bit lines are each formed by layer depositions and subsequent patterning or by doping with the aid of photolithographic process steps. The resistors are preferably produced by etching a contact hole at the crossover points between the relevant word lines and bit lines and forming a resistor in the contact hole. Since the memory cell configuration is programmed by this contact hole etching and formation of the resistor and it is generally regarded as advantageous to perform this programming at the end of production, it is advantageous to open the contact holes directly before the last metalization plane.

The contact holes can also be opened and suitably filled after the formation of bit lines and word lines.

With regard to the process of reading out the data, it is advantageous to realize the resistors with resistances in the megohm range. It lies within the scope of the invention to provide the resistors with an insulating tunnel layer. Tunnel layer is the term used to denote an insulating layer which is so thin that charge carriers can surmount the tunnel layer by virtue of the quantum mechanical tunneling effect and an electric current thus flows through the tunnel layer. Tunnel layers are usually formed from oxides, for example $Al_2O_3$ or $SiO_2$. In this case, the resistor comprises the tunnel layer and a conductive layer, for example doped polysilicon constituting the connection to the associated word or bit line. As an alternative, the resistors may be formed from weakly doped polysilicon and/or amorphous silicon.

In order to increase the packing density, it is advantageous to form the word lines using a spacer technique. To that end, first of all an auxiliary structure having strip-type elements is produced. A conductive layer is subsequently formed with essentially conformal edge coverage. By means of anisotropic etching which is selective with respect to the auxiliary structure, the word lines are then formed in the form of conductive spacers from the conductive layer. The dimensions of the auxiliary structures are limited, by the photolithography used, to a width and a spacing of the strip-type elements of F in each case, that is to say a minimum structure size that can be fabricated using the respective lithography. The conductive spacers form on both sidewalls of the strip-type elements, with the result that the density of the word lines is increased by a factor of 2 in comparison with the density that can be obtained by lithography.

During the read-out of the memory cell configuration having i bit lines and j word lines, the resistance of a driven word line turns out to have a maximum value of $R_{max/i}$ from the parallel circuit of i resistors having a resistance of $R_{max}$. If a resistor with a value of 1 MΩ, for example, is produced for one of the logic values, and if the feedback resistor also has a value of 1 MΩ, then a signal of 1 mV results for one logic value and a signal of 1 V results for the other logic value, given a total leakage current of 1 nA, provided that the word line is selected with a signal of 1 V, for example. The resistance of the driven word line is then at least 10 kΩ given 100 bit lines, for example.

Other features which are considered as characteristic for the invention are set forth in the appended claims.

Although the invention is. illustrated and described herein as embodied in a memory cell configuration and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3 and 4 are partial sectional views showing respective fabrication steps for forming a memory cell configuration having conductive spacers as word lines.

DESCRIPTION OF THE PREFERRED EMBODIMENTS

Figure 1:
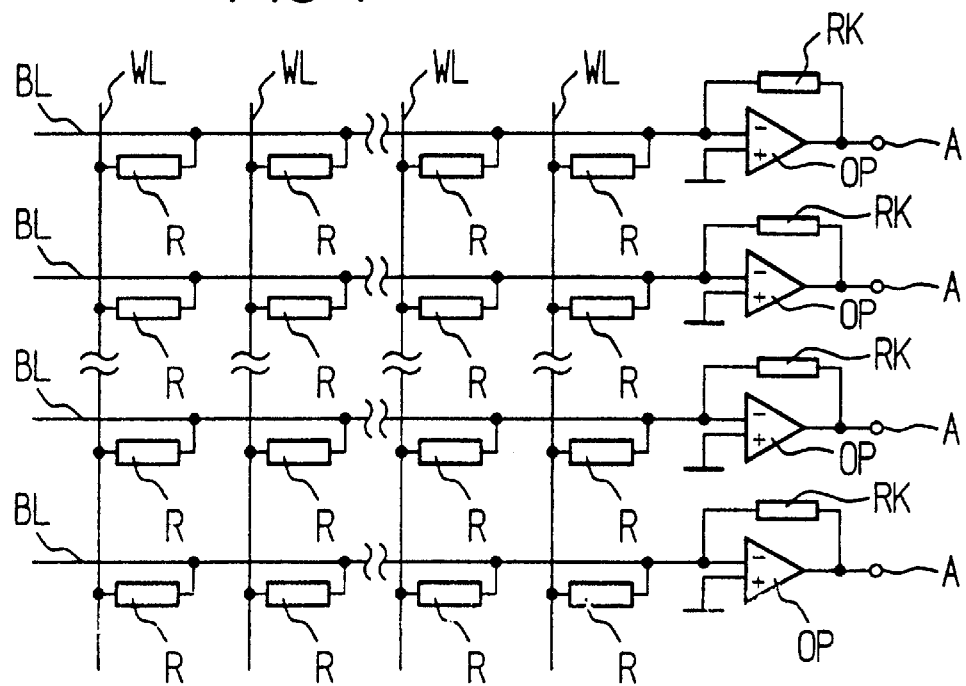
FIG. 1 is a diagrammatic view of the architecture for a memory cell configuration in which the logic values zero and one are realized by different resistors.

Referring now to the figures of the drawing in detail and first, particularly, to FIG. 1 thereof, there is shown a memory cell configuration with substantially parallel word lines WL and substantially parallel bit lines BL. The bit lines BL run transversely with respect to the word lines. A resistor R is connected between in each case one of the bit lines BL and one of the word lines WL. Some of the resistors R have a resistance of 1 megohm MΩ; the rest of the resistors have a resistance of 2 megohms. The resistance of 2 megohms is assigned to the logic value zero; the resistance of 1 megohm is assigned to the logic value one. 100 bit lines BL and 10,000 word lines WL are provided.

Each of the bit lines BL is connected to the inverting input of an operational amplifier OP. The non-inverting input of the operational amplifier OP is connected to ground potential. The operational amplifier OP has feedback via a feedback resistor RK.

In order to read out the information stored in the memory cell configuration, one of the word lines WL is selected by the application of a signal of 1 volt, for example. The remaining word lines are put at ground potential. As a result, a current path is connected between the selected word line WL and each of the bit lines BL. Since the bit lines BL are regulated to 0 volts in each case by the operational amplifiers OP, no current flow takes place between the bit lines BL. The output signal picked off in each case at the output A of each of the operational amplifiers OP is a measure of the resistance of the resistor R at the crossover point of the respective bit line BL and the selected word line WL. The following holds true for the output signal $V_{out}$:

$$V_{out} = 1V \cdot \frac{RK}{R + Rbl}$$

In this case, RK is the resistance of the feedback resistor RK, R is the resistance of the resistor R and Rbl is the resistance of the bit line BL. This relationship holds true because the bit line BL is regulated to 0 volts and the current flows through the bit line BL via the feedback resistor RK.

Figure 2:
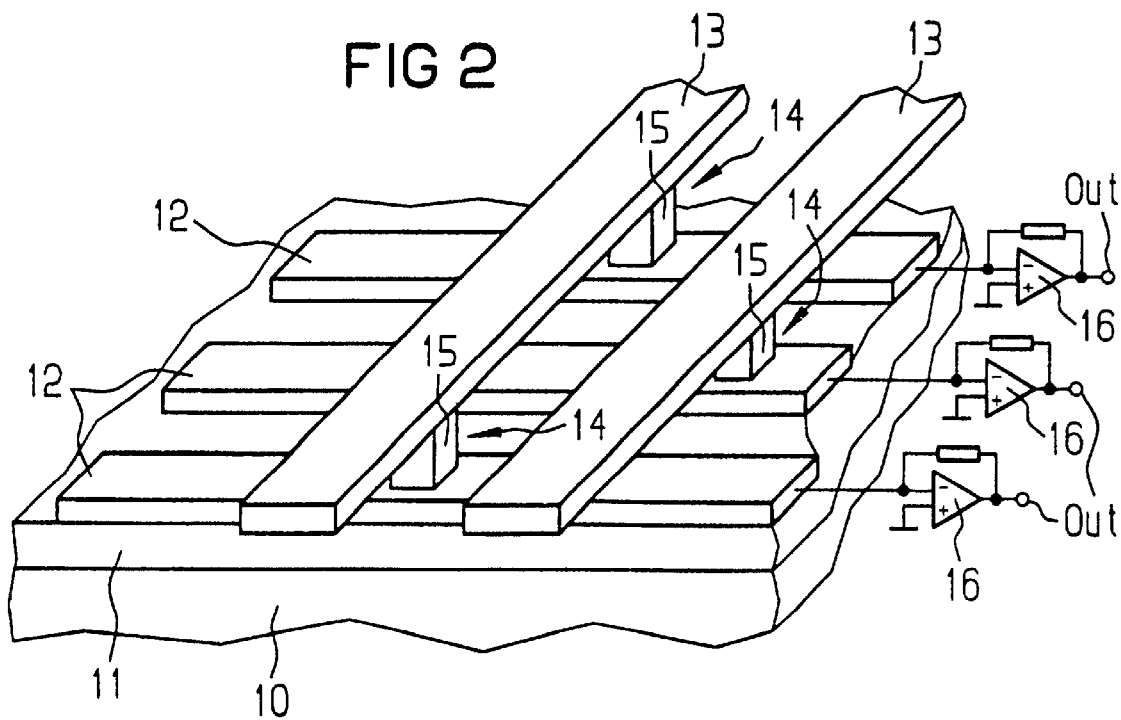
FIG. 2 is a perspective diagram of a detail of a memory cell configuration in which the logic values zero and one are realized by the formation of no contact hole or of a contact hole with a resistor.

Referring now to FIG. 2, a substrate 10 is provided with an insulating layer 11. The substrate 10 is, for example, a silicon wafer or the monocrystalline silicon layer of an SOI substrate. The insulating layer 11 contains $SiO_2$ and has a thickness of 100 nm.

Bit lines 12 are arranged on the surface of the insulating layer 11. The bit lines 12 are each in the form of a strip and run essentially parallel to one another. They have a length of 10 mm and a width of 0.5 μm. The spacing between neighboring bit lines 12 is 0.5 μm. The bit lines 12 contain aluminum or tungsten. They are produced by the deposition of a whole-area aluminum layer and subsequent patterning using photolithographic process steps. They are preferably formed in a semiconductor process at the same time as the fabrication of a metalization plane.

The bit lines 12 are covered with a non-illustrated intermediate oxide layer. Word lines 13 are arranged on the surface of the intermediate oxide layer, which has a thickness of 650 nm and is formed from $SiO_2$. The word lines 13 run transversely with respect to the bit lines 12. The word lines 13 have a length of 100 μm and a width of 0.5 μm. The spacing between neighboring word lines 13 is 0.5 μm. The word lines are formed from aluminum. To that end, an aluminum layer is deposited and patterned with the aid of photolithographic process steps. The word lines 13 are preferably formed at the same time as the fabrication of a metalization plane in a semiconductor process.

In order to program the memory cell configuration, after the completion of the bit lines 12 and the intermediate oxide layer lying above them, contact holes 14 are opened at those crossover points between one of the word lines 13 and one of the bit lines 12 at which a logic one is stored. To that end, use is made of a mask which is produced photolithographically and has openings at the locations for the contact holes 14. The contact holes 14 are formed by anisotropic etching using $CHF_3$, $CF_4$, Ar, for example.

Resistors 15 are subsequently formed in the contact holes 14 that have been opened. This is done for example by forming an $Al_2O_3$ layer with a layer thickness of 2 nm, which constitutes a tunnel oxide layer. The contact hole 14 is subsequently filled with aluminum. As an alternative, the resistors 15 are filled with weakly doped polysilicon or weakly doped amorphous silicon with a dopant concentration of $10^{14}$ cm$^{-3}$. A further possibility for forming the resistors 15 consists in filling the contact holes 14 with doped polysilicon with a dopant concentration in the neighborhood of $10^{14}$ cm$^{-3}$ and subsequently forming an SiO$_2$ layer by means of thermal oxidation with a layer thickness of 2 nm. The SiO$_2$ layer acts as a tunnel oxide layer. The resistors 15 have a resistance of 1 MΩ.

The bit lines 12 are each connected to the inverting input of an operational amplifier 16. The non-inverting input of the operational amplifier 16 is connected to ground potential in each case. The operational amplifier 16 is connected up with feedback.

During the operation of the memory cell configuration, the potential on the bit lines 12 is regulated to ground potential in each case by the operational amplifier 16. As explained with reference to FIG. 1, the output signal of the operational amplifier 16 is thus a measure of the resistance which is effective between a selected word line 13 and the associated bit line 12. Since, in this exemplary embodiment, no contact hole 14 is opened and no resistor 15 is formed for the logic value zero, the resistance between the word lines 13 and the bit lines 12 at whose crossover point a zero is stored is infinite. The output signal is approximately zero in this case. This embodiment therefore has the advantage that the logic values zero and one can easily be distinguished.

Referring now to FIG. 3, an insulating layer 21 is arranged on the surface of a substrate 20. The substrate 20 is, for example, a monocrystalline silicon wafer or the monocrystalline silicon layer of an SOI substrate. The insulating layer 21 contains SiO$_2$ and has a thickness of 100 nm. Strip-type auxiliary structures 22 are formed on the surface of the insulating layer 21. The strip-type auxiliary structures 22 are likewise produced from SiO$_2$, for example, by means of anisotropic etching with the aid of a mask formed photolithographically. The strip-type auxiliary structures 22 have a width of 0.5 μm and a spacing of 0.5 μm. This width corresponds to the minimum structure width F in 16 M technology.

A conductive layer 23 is deposited over the whole area with essentially conformal edge coverage. The conductive layer 23 is formed to a thickness of 150 nm, for example. The conductive layer 23 contains doped polysilicon and metal silicide, for example. The doped polysilicon has a dopant concentration of $10^{21}$ cm$^{-3}$ in this case. TiSi$_2$ or CoSi$_2$, for example, is suitable as the metal silicide.

With reference to FIG. 4, conductive spacers 24 are formed on the sidewalls of the auxiliary structures 22 by means of anisotropic etching selectively with respect to SiO$_2$ using Cl$_2$, CF$_4$, for example. The spacers are used as word lines. In a semiconductor process, the conductive spacers 24 are preferably formed at the same time as other conductive spacers of the same material, which are used for example as gate electrodes or other connections in the semiconductor circuit.

An intermediate oxide layer 25 having a thickness of 400 nm is subsequently formed. The intermediate oxide layer 25 is formed for example from borophosphorus silicate glass and has an essentially planar surface. The intermediate oxide layer 25 covers the auxiliary structures 22 and the conductive spacers 24.

In order to program the memory cell configuration, contact holes 27 are subsequently opened, in an analogous manner to that outlined with reference to FIG. 2, at those crossover points between one of the bit lines 26 and one of the conductive spacers 24 serving as word lines at which a logic one is stored. Since two conductive spacers 24 come to a path having a length of 2 F and the contact holes 27 can be formed with dimensions of F as a minimum, neighboring contact holes 27 coincide. This is indicated by the dotted line in FIG. 4.

The contact holes 27 are subsequently filled in order to form resistors 28. The same materials which have been explained in the exemplary embodiment described with reference to FIG. 2 can be used as the material for the resistors 28.

A conductive layer made for example of aluminum is deposited on the surface of the intermediate oxide layer 25 and the filled contact holes 27 and is patterned with the aid of photolithographic process steps, in order to form bit lines 26. The bit lines 26 run transversely with respect to the conductive spacers 24. The bit lines 26 run parallel to the second plane.

As explained with reference to FIGS. 1 and 2, the bit lines 26 are each connected to the inverting input of an operational amplifier. The further connection of the operational amplifier and the read-out process are effected in a manner analogous to that explained with reference to FIGS. 1 and 2.

We claim:

1. A memory cell configuration, comprising:

a semiconductor layer structure having a plurality of substantially parallel word lines, a plurality of substantially parallel bit lines running transversely to said word lines, and an insulating layer between said word lines and said bit lines;

said insulating layer being formed with contact holes at crossover points between said bit lines and said word lines;

resistors having a resistance higher than a resistance of said word lines and a resistance of said bit lines, said resistors connected between said word lines and said bit lines, said resistors each disposed in a respective said contact hole between a respective said bit line and a respective said word line, said resistors including first resistors and second resistors with mutually different resistances, said first resistors representing a first logic value and said second resistors representing a second logic value; and a sense amplifier connected to each said bit line for regulating a potential on the respective said bit line to a reference potential and for outputting an output signal, said sense amplifier having a feedback operational amplifier.

2. The memory cell configuration according to claim 1, wherein a number of said word lines is greater than a number of said bit lines.

3. A method of fabricating a memory cell configuration, which comprises the following steps:

forming a plurality of substantially parallel word lines, a plurality of substantially parallel bit lines, and an insulating layer on a surface of a substrate, whereby the word lines run transversely to the bit lines and the insulating layer is disposed between the word lines and the bit lines;

forming the word lines by:
  first producing an auxiliary structure having strip-type elements;
  producing a conductive layer with substantially conformal edge coverage; and
  forming the word lines in the form of conductive spacers from the conductive layer by anisotropic etching selective with respect to the auxiliary structure;
opening contact holes each disposed between one of the bit lines and one of the word lines at predetermined crossover points between the bit lines and the word lines in the insulating layer;
forming a resistor in each of the contact holes and connecting the resistor between the respective bit line and the respective word line, the resistor having a higher resistance than the bit lines and the word lines; and
producing sense amplifiers each connected to a respective bit line, and enabling the sense amplifiers to regulate a potential on the respective bit line to a reference potential and to output an output signal.

4. The method according to claim 3, wherein the resistors are formed with at least one material selected from the group consisting of $Al_2O_3$, $SiO_2$, polysilicon, and amorphous silicon.

5. A memory cell configuration, comprising:

a semiconductor layer structure having a plurality of substantially parallel word lines, a plurality of substantially parallel bit lines running transversely to said word lines, and an insulating layer between said word lines and said bit lines, a number of said word lines being greater than a number of said bit lines;

said insulating layer being formed with contact holes at crossover points between said bit lines and said word lines;

resistors having a resistance higher than a resistance of said word lines and a resistance of said bit lines, said resistors connected between said word lines and said bit lines, said resistors each being disposed in a respective said contact hole between a respective said bit line and a respective said word line; and a sense amplifier connected to each said bit line for regulating a potential on the respective said bit line to a reference potential and for outputting an output signal.

* * * * *